US012696637B2

(12) United States Patent
Shin et al.

(10) Patent No.: US 12,696,637 B2
(45) Date of Patent: Jul. 28, 2026

(54) DISPLAY DEVICE INCLUDING HETEROGENEOUS THIN FILM TRANSISTORS

(71) Applicant: LG Display Co., Ltd., Seoul (KR)

(72) Inventors: Dongchae Shin, Paju-si (KR); Sangsoon Noh, Paju-si (KR); Mijin Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 528 days.

(21) Appl. No.: 18/199,001

(22) Filed: May 18, 2023

(65) Prior Publication Data

US 2023/0389380 A1 Nov. 30, 2023

(30) Foreign Application Priority Data

May 31, 2022 (KR) ........................ 10-2022-0066661

(51) Int. Cl.
H10K 59/131 (2023.01)
H10K 59/121 (2023.01)
H10K 59/88 (2023.01)

(52) U.S. Cl.
CPC ....... H10K 59/131 (2023.02); H10K 59/1213 (2023.02); H10K 59/88 (2023.02)

(58) Field of Classification Search
CPC .. H10K 59/131; H10K 59/1213; H10K 59/88; H10K 59/1216; H10K 59/124;
(Continued)

(56) References Cited

U.S. PATENT DOCUMENTS 7,394,446 B2 * 7/2008 Park ..................... H10K 59/131
345/82
7,897,450 B2 * 3/2011 Koehler ............... H10D 64/693
438/791
(Continued)

FOREIGN PATENT DOCUMENTS

CN 113270427 A 8/2021
CN 113903797 A 1/2022
(Continued)

OTHER PUBLICATIONS

The Japan Patent Office, Office Action, Japanese Patent Application No. 2023-084666, Jun. 25, 2024, eight pages.
(Continued)

*Primary Examiner* — Caleb E Henry
(74) *Attorney, Agent, or Firm* — Fenwick & West LLP

(57) ABSTRACT

Provided is an organic light emitting display device in which a driving thin film transistor (TFT) includes an oxide semiconductor pattern. The driving thin film transistor includes a gate electrode disposed under an oxide semiconductor pattern, and a dummy electrode, a source electrode and a drain electrode over the oxide semiconductor pattern, and the dummy electrode is electrically connected to the source electrode to increase the S-factor of the driving TFT. In addition, the organic light emitting display device of the present disclosure includes a plurality of switching TFTs including an oxide semiconductor pattern, and the plurality of switching TFTs includes a plurality of switching thin film transistors having different distances between the oxide semiconductor pattern and the gate electrode so as to have different threshold voltages.

25 Claims, 9 Drawing Sheets

(58) Field of Classification Search

CPC .... H10K 71/00; H10K 71/231; H10K 71/166; H10K 59/123; H10K 59/8051; H10K 59/8052; H10D 30/6755; H10D 30/6723; H10D 30/6734; H10D 86/441; H10D 86/481; H10D 86/423; H10D 86/60; H10D 30/67; H10D 30/6729; H10D 30/6704; H01L 27/1214; H01L 27/1225; H01L 27/124; H01L 29/41733; H01L 29/42384; H01L 29/7869; H01L 27/3262; H01L 27/3258; H01L 27/3248; H01L 27/3276; H01L 51/56

See application file for complete search history.

(56) References Cited

U.S. PATENT DOCUMENTS

| | | | | |
|---|---|---|---|---|
| 7,902,640 | B2 * | 3/2011 | Hsu | H10D 30/0316 |
| | | | | 257/E21.293 |
| 8,866,706 | B2 * | 10/2014 | Kang | H10K 59/80516 |
| | | | | 313/500 |
| 8,933,444 | B2 | 1/2015 | Saito et al. | |
| 9,142,425 | B2 | 9/2015 | Ando | |
| 9,853,067 | B2 * | 12/2017 | Cai | H10D 86/60 |
| 10,134,912 | B2 * | 11/2018 | Kimura | H10D 30/6713 |
| 10,153,446 | B2 | 12/2018 | Maruyama | |
| 10,236,330 | B2 | 3/2019 | Maruyama | |
| 10,483,339 | B2 * | 11/2019 | Moon | H10K 59/123 |
| 10,886,351 | B2 | 1/2021 | Maruyama | |
| 10,991,784 | B2 * | 4/2021 | Kwon | H10D 30/6729 |
| 11,063,068 | B2 | 7/2021 | Jeon et al. | |
| 11,189,745 | B2 | 11/2021 | Tsubuku et al. | |
| 11,404,516 | B2 | 8/2022 | Maruyama | |
| 11,423,827 | B2 * | 8/2022 | Kim | H10K 59/122 |
| 11,552,112 | B2 * | 1/2023 | Lim | H10D 86/481 |
| 11,744,111 | B2 | 8/2023 | Maruyama | |
| 2003/0085405 | A1 * | 5/2003 | Park | H10K 59/131 |
| | | | | 257/72 |
| 2005/0275038 | A1 * | 12/2005 | Shih | H10D 30/6755 |
| | | | | 257/382 |
| 2006/0157754 | A1 * | 7/2006 | Jeon | H01L 21/02159 |
| | | | | 438/257 |
| 2006/0234430 | A1 * | 10/2006 | Liu | H10K 10/474 |
| | | | | 438/149 |
| 2008/0073649 | A1 * | 3/2008 | Kim | H10D 86/441 |
| | | | | 257/E21.414 |
| 2008/0085583 | A1 * | 4/2008 | Park | H10B 41/30 |
| | | | | 257/E29.302 |
| 2008/0117146 | A1 * | 5/2008 | Iida | G09G 3/3233 |
| | | | | 345/76 |
| 2010/0001346 | A1 * | 1/2010 | Ye | H10D 30/6755 |
| | | | | 257/E21.411 |
| 2010/0133539 | A1 * | 6/2010 | Kang | H10D 86/00 |
| | | | | 257/E21.535 |
| 2011/0157110 | A1 * | 6/2011 | Chou | H10K 59/1315 |
| | | | | 345/80 |
| 2012/0001885 | A1 * | 1/2012 | Kang | H10K 59/1795 |
| | | | | 445/24 |
| 2013/0270527 | A1 * | 10/2013 | Kwon | H10D 30/6755 |
| | | | | 254/43 |
| 2013/0313545 | A1 * | 11/2013 | Saito | H10K 59/1213 |
| | | | | 257/43 |
| 2014/0183528 | A1 * | 7/2014 | Endo | H10D 86/60 |
| | | | | 257/43 |
| 2014/0273342 | A1 * | 9/2014 | Yim | H10D 30/6755 |
| | | | | 438/104 |
| 2015/0017761 | A1 * | 1/2015 | Ando | H10D 99/00 |
| | | | | 438/104 |

| | | | | |
|---|---|---|---|---|
| 2015/0316976 | A1 | 11/2015 | Toyotaka et al. | |
| 2016/0064462 | A1 * | 3/2016 | Yoon | H10D 30/6757 |
| | | | | 257/40 |
| 2016/0155849 | A1 | 6/2016 | Noda | |
| 2017/0278916 | A1 * | 9/2017 | Maruyama | H10D 86/021 |
| 2017/0278977 | A1 * | 9/2017 | Jeong | H10D 30/6755 |
| 2017/0294464 | A1 * | 10/2017 | Kwon | H10D 30/6755 |
| 2017/0294498 | A1 * | 10/2017 | Kwon | H10D 86/40 |
| 2018/0026055 | A1 * | 1/2018 | Rui | H10D 30/6745 |
| | | | | 257/71 |
| 2018/0033849 | A1 * | 2/2018 | Noh | H10K 59/88 |
| 2018/0061922 | A1 * | 3/2018 | Kim | H10K 59/1213 |
| 2018/0090695 | A1 * | 3/2018 | Maruyama | H10D 86/423 |
| 2018/0277614 | A1 | 9/2018 | Ono et al. | |
| 2019/0088793 | A1 * | 3/2019 | Kimura | G09G 3/3648 |
| 2019/0165071 | A1 | 5/2019 | Maruyama | |
| 2020/0144309 | A1 * | 5/2020 | Jeon | H10D 86/421 |
| 2020/0258966 | A1 * | 8/2020 | Cha | H10K 59/1216 |
| 2020/0343275 | A1 * | 10/2020 | Park | H10D 30/674 |
| 2020/0350341 | A1 | 11/2020 | Hanada et al. | |
| 2021/0005771 | A1 * | 1/2021 | Tsubuku | G06F 1/1605 |
| 2021/0043707 | A1 | 2/2021 | Park et al. | |
| 2021/0056898 | A1 * | 2/2021 | Park | H10K 59/1213 |
| 2021/0083029 | A1 | 3/2021 | Maruyama | |
| 2021/0202634 | A1 * | 7/2021 | Moon | H10D 86/60 |
| 2021/0265579 | A1 | 8/2021 | Lee et al. | |
| 2021/0408061 | A1 * | 12/2021 | Shin | H10K 59/1213 |
| 2022/0005904 | A1 | 1/2022 | Moon et al. | |
| 2022/0069021 | A1 | 3/2022 | Kim et al. | |
| 2022/0140038 | A1 * | 5/2022 | Bae | H10K 59/1213 |
| | | | | 257/40 |
| 2022/0231170 | A1 * | 7/2022 | Fan | H10D 30/6755 |
| 2022/0310735 | A1 | 9/2022 | Maruyama | |
| 2023/0013464 | A1 * | 1/2023 | Hong | H10K 59/1201 |
| 2023/0169922 | A1 * | 6/2023 | Watakabe | H10D 30/67 |
| | | | | 345/204 |
| 2023/0252930 | A1 | 8/2023 | Chen et al. | |
| 2023/0284487 | A1 | 9/2023 | Na et al. | |
| 2023/0329037 | A1 | 10/2023 | Zhao et al. | |
| 2023/0354647 | A1 | 11/2023 | Maruyama | |

FOREIGN PATENT DOCUMENTS

| | | |
|---|---|---|
| JP | 2009-122253 A | 6/2009 |
| JP | 2013-246248 A | 12/2013 |
| JP | 2015-228019 A | 12/2015 |
| JP | 2018-054677 A | 4/2018 |
| JP | 2022-13773 A | 1/2022 |
| JP | 2022-031020 A | 2/2022 |
| KR | 10-2016-0066525 A | 6/2016 |
| KR | 10-2018-0034210 A | 4/2018 |
| TW | 201503265 A | 1/2015 |
| TW | 201735373 A | 10/2017 |
| TW | 202036895 A | 10/2020 |
| WO | 2019/146264 A1 | 8/2019 |
| WO | WO 2019/181558 A1 | 9/2019 |
| WO | WO 2022/036864 A1 | 2/2022 |

OTHER PUBLICATIONS

Taiwan Intellectual Property Office, Office Action, Taiwanese Patent Application No. 112119759, Dec. 12, 2023, 10 pages.

European Patent Office, Extended European Search Report, European Patent Application No. 23173578.8, Oct. 11, 2023, eight pages.

European Patent Office, Extended European Search Report, European Patent Application No. 25185520.1, Sep. 24, 2025, seven pages.

Korean Intellectual Property Office, Office Action, Korean Patent Application No. 10-2022-0066661, Aug. 26, 2025, 25 pages.

* cited by examiner

DISPLAY DEVICE INCLUDING HETEROGENEOUS THIN FILM TRANSISTORS

CROSS REFERENCE TO RELATED APPLICATION

The present application claims the benefit under 35 USC § 119(a) of Republic of Korea Patent Application No. 10-2022-0066661, filed May 31, 2022, in the Korean Intellectual Property Office, the contents of which are incorporated by reference in their entirety.

TECHNICAL FIELD

The present disclosure relates to an organic light emitting display device, and more particularly, to an organic light emitting display device including hybrid-type thin film transistors using different types of semiconductor materials in configuring a plurality of thin film transistors constituting the pixel circuit portion and the plurality of TFTs constituting a GIP circuit portion in a sub-pixel.

BACKGROUND

Organic light emitting display devices use self-emitting light emitting elements without using a back-light unlike liquid crystal displays and thus, are becoming the mainstream in the display field due to their excellent thin film properties and image quality.

In particular, since the light emitting elements may be formed on a flexible substrate, a screen is configured in various types, such as a bending type or a folding type, and is suitable as a display device for small electronic products such as smart watches due to its excellent thin film properties.

In addition, there is a need for a display device having a new type of pixel circuit capable of preventing leakage current in a still screen in order to be applied to a display device such as a smart watch in which many still screens are generated.

A thin film transistor (TFT) using an oxide semiconductor as an active layer has been proposed to prevent leakage current.

However, since a display device using hybrid type thin film transistors uses different types of semiconductor devices, for example, a polycrystalline TFT using a polycrystalline semiconductor pattern as an active layer and an oxide TFT, a process of forming the polycrystalline semiconductor pattern and a process of forming the oxide semiconductor pattern are necessarily performed separately, thereby making processing complicated. In addition, the polycrystalline semiconductor pattern and the oxide semiconductor pattern have different etching characteristics with respect to chemical gases, thereby making processing more complicated.

In particular, since the polycrystalline semiconductor pattern has a faster movement speed of carriers such as electrons and holes than that of the oxide semiconductor pattern, the polycrystalline semiconductor pattern is suitable for driving TFTs requiring fast driving. As a result, driving TFTs use a polycrystalline semiconductor pattern.

However, a driving TFT using a polycrystalline semiconductor pattern has a high driving speed, but has a problem of being disadvantageous in expressing low grayscales because of a large fluctuation rate in current due to current stress. Accordingly, an object of the present disclosure is to provide a pixel circuit portion having a small fluctuation rate in current after current stress and a large s-factor value while constituting a driving TFT using an oxide semiconductor pattern.

SUMMARY

In one embodiment, a thin film transistor comprises: a semiconductor pattern including a channel region, a source region at a first end of the channel region, and a drain region at a second end of the channel region that is opposite the first end; a gate electrode overlapping the channel region, the gate electrode under the semiconductor pattern; a source electrode and a drain electrode over the semiconductor pattern, the source electrode connected to the source region of the semiconductor pattern and the drain electrode connected to the drain region of the semiconductor pattern; and a dummy electrode over the semiconductor pattern and overlapping the semiconductor pattern, the dummy electrode connected to either the source electrode or the drain electrode.

In one embodiment, a display device a substrate comprises: a display area and a non-display area adjacent to the display area; a first thin film transistor (TFT) on the substrate, the first TFT including a first semiconductor pattern, a first gate electrode, and a first source electrode and a first drain electrode over the first semiconductor pattern; a second TFT on the substrate, the second TFT including a second semiconductor pattern in a different layer from the first semiconductor pattern, a second gate electrode under the second semiconductor pattern, and a second source electrode and a second drain electrode over the second semiconductor pattern; and a dummy electrode connected to either the second source electrode or the second drain electrode, the dummy electrode overlapping the second semiconductor pattern.

In one embodiment, a display device comprising a substrate having an active area that displays an image and a non-active area that does not display the image; a light emitting element on the active area, the light emitting element including a first electrode, a light emitting layer on the first electrode, and a second electrode on the light emitting layer; a first thin film transistor that is connected to the light emitting element. The first thin film transistor comprises a first semiconductor pattern including a first channel region, a first source region at a first end of the first channel region, and a first drain region at a second end of the first channel region that is opposite the first end; a first gate electrode overlapping a first side of the first semiconductor pattern; a first source electrode connected to the first source region of the first semiconductor pattern; a first drain electrode connected to the first drain region of the first semiconductor pattern, and a dummy electrode overlapping a second side of the first semiconductor pattern that is opposite the first side of the semiconductor pattern, the dummy electrode connected to either the first source electrode or the first drain electrode.

The organic light emitting display of the present disclosure may reduce leakage current in an off state by including a switching TFT and a driving TFT including an oxide semiconductor pattern, thus reducing power consumption.

In addition, it is possible to reduce an effective voltage applied to the oxide semiconductor pattern by controlling the parasitic capacitance formed in the driving TFT, thus controlling defects such as stains through precise grayscale expression in low grayscales.

In addition, the driving TFT uses a bottom gate structure in which a gate electrode is disposed below an active layer and includes a dummy electrode disposed over the active layer, thus protecting the active layer from hydrogen particles that may be introduced from above and below the active layer.

In addition, when a plurality of layers is formed for the configuration of TFTs, a mask may be used in an integrated manner, thereby simplifying the process.

In addition, oxide TFTs having different structures may be disposed in a pixel circuit portion of one sub-pixel.

DETAILED DESCRIPTION

Figure 1:
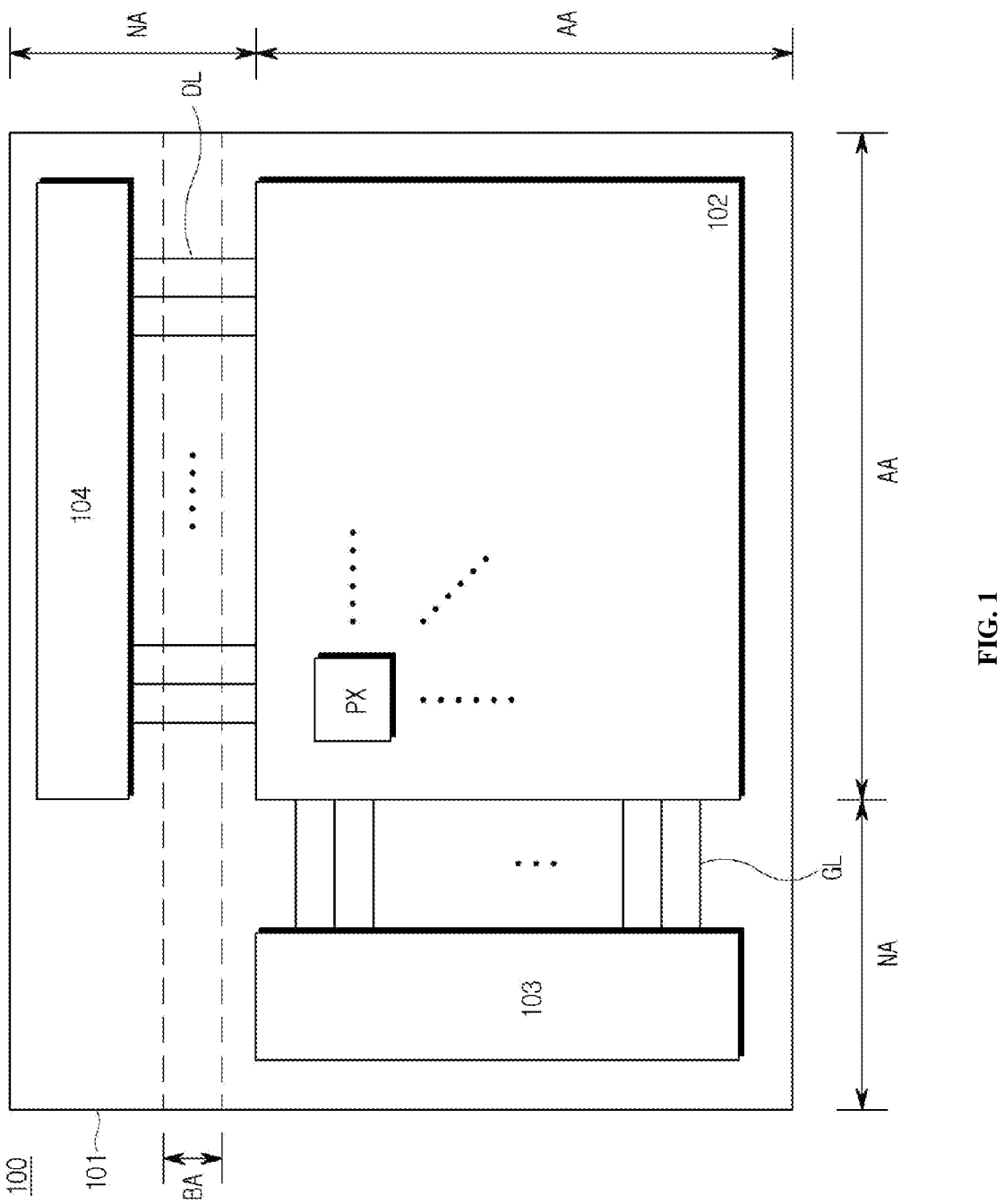
FIG. 1 is a schematic diagram of a display device according to an embodiment of the present disclosure.

Advantages and features of the present disclosure, and a method of achieving them will become apparent with reference to the embodiments described below in detail in conjunction with the accompanying drawings. However, the present disclosure is not limited to the embodiment to be disclosed below and is implemented in different and various forms. The embodiments bring about the complete disclosure of the present disclosure and are only provided to make those skilled in the art understand the scope of the present disclosure.

The shapes, sizes, ratios, angles, numbers, and the like illustrated in the accompanying drawings for describing various embodiments of the present disclosure are merely examples, and the present disclosure is not limited thereto. Like reference numerals generally denote like elements throughout the specification. Further, in the following description of the present disclosure, a detailed description of known related technologies may be omitted to avoid unnecessarily obscuring the subject matter of the present disclosure.

The terms such as "including," "having," and "comprising" used herein are generally intended to allow other elements to be added unless the terms are used with the term "only". Any references to singular may include plural unless expressly stated otherwise.

Elements are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

Spatially relative terms, such as "under," "below," "beneath", "lower," "over," "upper" and the like, may be used herein for ease of description to describe one element or feature's relationship to another element(s) or feature(s) as illustrated in the figures. It will be understood that the spatially relative terms can encompass different orientations of an element in use or operation in addition to the orientation depicted in the figures. For example, if an element in the figures is inverted, elements described as "below" or "beneath" other elements or features would then be oriented "over" the other elements or features. Thus, the exemplary term "below" can encompass both an orientation of below and above. Similarly, the exemplary term "above" or "over" can encompass both an orientation of "above" and "below".

In describing temporal relationship, terms such as "after," "subsequent to," "next to," "before," and the like may include cases where any two events are not consecutive, unless the term "immediately" or "directly" is explicitly used.

In describing elements, terms such as "first" and "second" are used, but the elements are not limited by these terms. These terms are simply used to distinguish one element from another. Accordingly, as used herein, a first element may be a second element within the technical idea of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

When reference numerals are given to elements of drawings describing the embodiments of the present disclosure, the same elements are designated by the same reference numerals as much as possible even though they are shown in different drawings.

In the aspects of the present disclosure, a source electrode and a drain electrode are distinguished from each other, for convenience of description. However, the source electrode and the drain electrode are used interchangeably. The source electrode may be the drain electrode, and the drain electrode may be the source electrode. Also, the source electrode in any one aspect of the present disclosure may be the drain electrode in another aspect of the present disclosure, and the drain electrode in any one aspect of the present disclosure may be the source electrode in another aspect of the present disclosure.

In one or more aspects of the present disclosure, for convenience of explanation, a source region is distinguished from a source electrode, and a drain region is distinguished from a drain electrode. However, aspects of the present disclosure are not limited to this structure. For example, the source region may be the source electrode, and the drain region may be the drain electrode. Also, the source region may be the drain electrode, and the drain region may be the source electrode.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, various embodiments of the present disclosure will be described in detail with reference to the accompanying drawings.

FIG. 1 is a plan view showing a display device 100 according to the present disclosure.

A display panel 102 may include a display area AA provided on a substrate 101 and non-display areas NA disposed in the vicinity of (e.g., adjacent to) the display area AA or surrounded in the display area AA. The substrate 101 may include glass, plastic, or a flexible polymer film. For example, the flexible polymer film may be made of a plastic material having flexibility to enable bending. For example, the substrate 101 may be made of a material such as polyimide (PI), polyethylene terephthalate (PET), acrylonitrile-butadiene-styrene copolymer (ABS), polymethyl methacrylate (PMMA), polyethylene naphthalate (PEN), polycarbonate (PC), polyethersulfone (PES), polyarylate (PAR), polysulfone (PSF), or cyclic-olefin copolymer, cyclic olefin copolymer (COC), triacetylcellulose (TAC) film, polyvinyl alcohol (PVA) film, and polystyrene (PS). However, glass is not excluded as a material for the substrate.

A sub-pixel in the display area AA may include a TFT using an oxide semiconductor material or polycrystalline silicon semiconductor as an active layer. For example, the oxide semiconductor material may be formed of any one of indium gallium zinc oxide (IGZO), indium zinc oxide (IZO), indium gallium tin oxide (IGTO), and indium gallium oxide (IGO), but is not limited thereto.

At least one of a data driver 104 and a gate driver 103 may be disposed in the non-display area NA. In addition, the substrate 101 may further include a bending area BA where the substrate 101 is bent. For example, the bending region BA may be provided in the display area AA.

Among them, the gate driver 103 may be directly formed on the substrate 101 using a TFT using a polycrystalline semiconductor material as an active layer, or may be formed by including a TFT using a polycrystalline semiconductor material as an active layer and a TFT using an oxide semiconductor material as an active layer, which are paired, the present disclosure is not limited thereto. In a case where TFTs respectively disposed in the non-display area NA and the display area AA include the same semiconductor material, the forming of TFTs respectively disposed in the non-display area NA and the display area AA may be simultaneously performed in the same process.

The TFT having an oxide semiconductor pattern and the TFT having a polycrystalline semiconductor pattern may have high electron mobility in a channel, thus implementing high resolution and low power consumption.

A plurality of data lines and a plurality of gate lines may be disposed in the display area AA. For example, the plurality of data lines may be arranged in rows or columns, and the plurality of gate lines may be arranged in columns or rows. Also, a sub-pixel PX may be disposed in an area defined by the data line and the gate line.

The gate driver 103 including a gate driver circuit may be disposed in the non-display area NA. The gate driving circuit of the gate driver 103 may sequentially drive pixel rows in the display area by sequentially supplying a scan signal to the plurality of gate lines GL. Herein, the gate driving circuit may be also referred to as a scan driving circuit. Here, the pixel row may refer to a row including pixels connected to one gate line.

The gate driving circuit may include TFTs having a polycrystalline semiconductor pattern or TFTs having an oxide semiconductor pattern. Alternatively, the gate driving circuit may include a pair of TFTs comprised of one TFT having a polycrystalline semiconductor pattern and the other TFT having an oxide semiconductor pattern. When the same semiconductor material is used for TFTs disposed in the non-display area NA and the display area AA, the TFTs may be formed simultaneously in the same process.

The gate driving circuit may include a shift register, a level shifter, and the like.

As in the display device according to the embodiment of the present disclosure, the gate driving circuit may be implemented in a Gate In Panel (GIP) type and directly disposed on the substrate 101. Alternatively, the gate driver 103 can be integrated and arranged on the display panel 102, or each gate driver 103 can be implemented by a chip-on-film COF method in which an element is mounted on a film connected to the display panel 102.

The gate driver 103 including the gate driving circuit may sequentially supply a scan signal with an On voltage or an Off voltage to a plurality of gate lines.

The display device 100 according to an embodiment of the present disclosure may further include a data driving circuit. The data driving circuit may convert image data into an analog data voltage and supply the analog data voltage to the plurality of data lines when a specific gate line is enabled by the gate driver 103 including the gate driving circuit. The data lines DL may be connected with the data driver 104 through a data pad. Although the data driver 104 is shown as being disposed on one side of the display panel 102 in FIG. 1, the number and position of the data driver 104 are not limited thereto.

The plurality of gate lines GL disposed on the substrate 101 may include a plurality of scan lines and a plurality of light emitting control lines. The plurality of scan lines and the plurality of light emitting control lines may be lines that transmit different types of gate signals (scan signals and light emitting control signals) to gate nodes of different types of transistors (scan transistors and light emitting control transistors).

The gate driver 103 including the gate driving circuit may include a scan driving circuit that outputs scan signals to a plurality of scan lines, which are one type of gate lines GL and a light emitting driving circuit that outputs light emitting control signals to a plurality of light emitting control lines, which are another type of gate lines.

The data lines DL may be disposed to pass through the bending area BA, and various data lines DL may be disposed and connected to a data pad PAD.

The bending area BA may be an area where the substrate 101 is bent. The substrate 101 may be maintained in a flat state except for the bending area BA.

Figure 2:
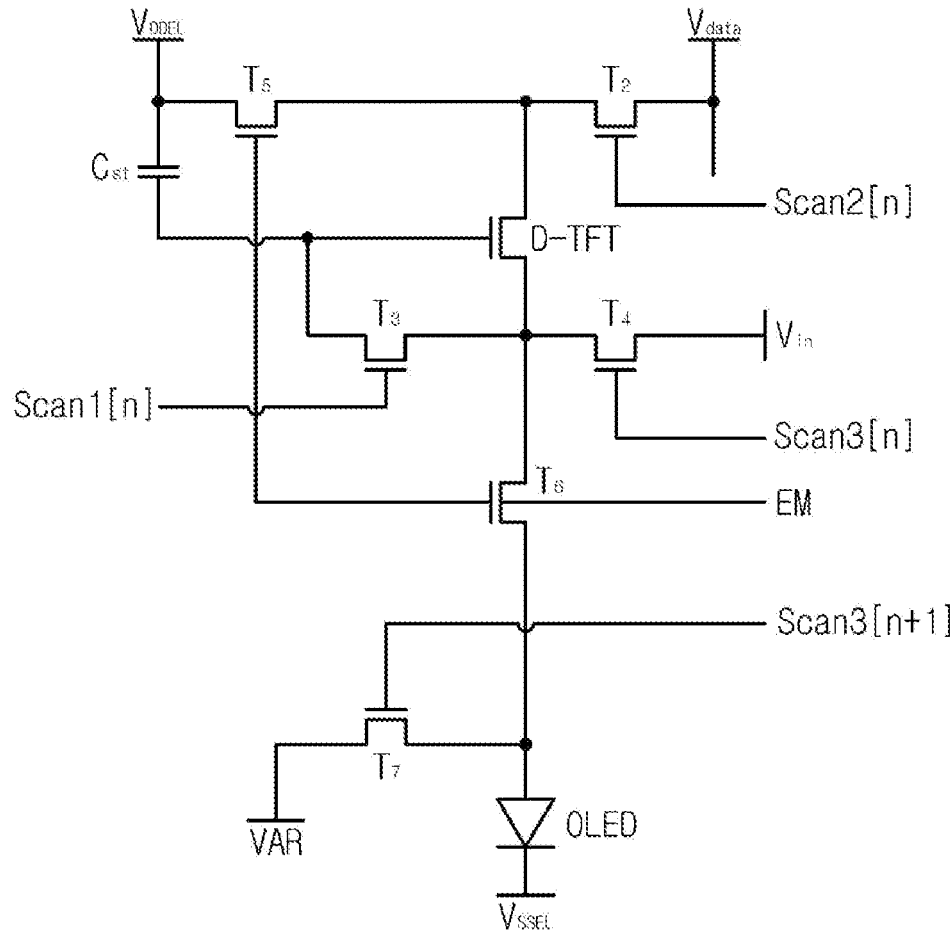
FIG. 2 is a circuit diagram illustrating a pixel circuit driving one pixel in a display device according to an embodiment of the present disclosure.

FIG. 2 is a pixel circuit diagram of a sub-pixel provided in an embodiment of the present disclosure. As an example, a circuit diagram of a pixel including seven TFTs and one storage capacitor is shown. One of the seven TFTs may be a driving TFT and the remaining TFTs may be switching TFTs for internal compensation (for example, a threshold voltage and/or mobility) of a TFT, but embodiments of the present disclosure are not limited thereto.

As an example, in the present disclosure, the driving TFT (D-TFT) may be a switching TFT using an oxide semiconductor pattern as an active layer and the remaining TFTs may be switching TFTs using an oxide semiconductor pattern as an active layer. In addition, at least one of the switching TFTs for internal compensation may use a polycrystalline semiconductor pattern as an active layer. However, the present disclosure is not limited to the circuit diagram of the pixel shown in FIG. 2 and various configurations of internal compensation circuits are possible. For example, a number of TFTs in the pixel circuit of the present disclosure may be three or more, and a number of storage capacitor may be one or more, for example, the pixel circuit of the present disclosure also may be a 3T1C pixel circuit including three TFTs and one storage capacitor, a 3T2C pixel circuit including three TFTs and two storage capacitors, a 5T1C pixel circuit including five TFTs and one storage capacitor, a 5T2C pixel circuit including five TFTs and two storage capacitors, a 7T2C pixel circuit including seven TFTs and two storage capacitors, or the like.

Figure 3:
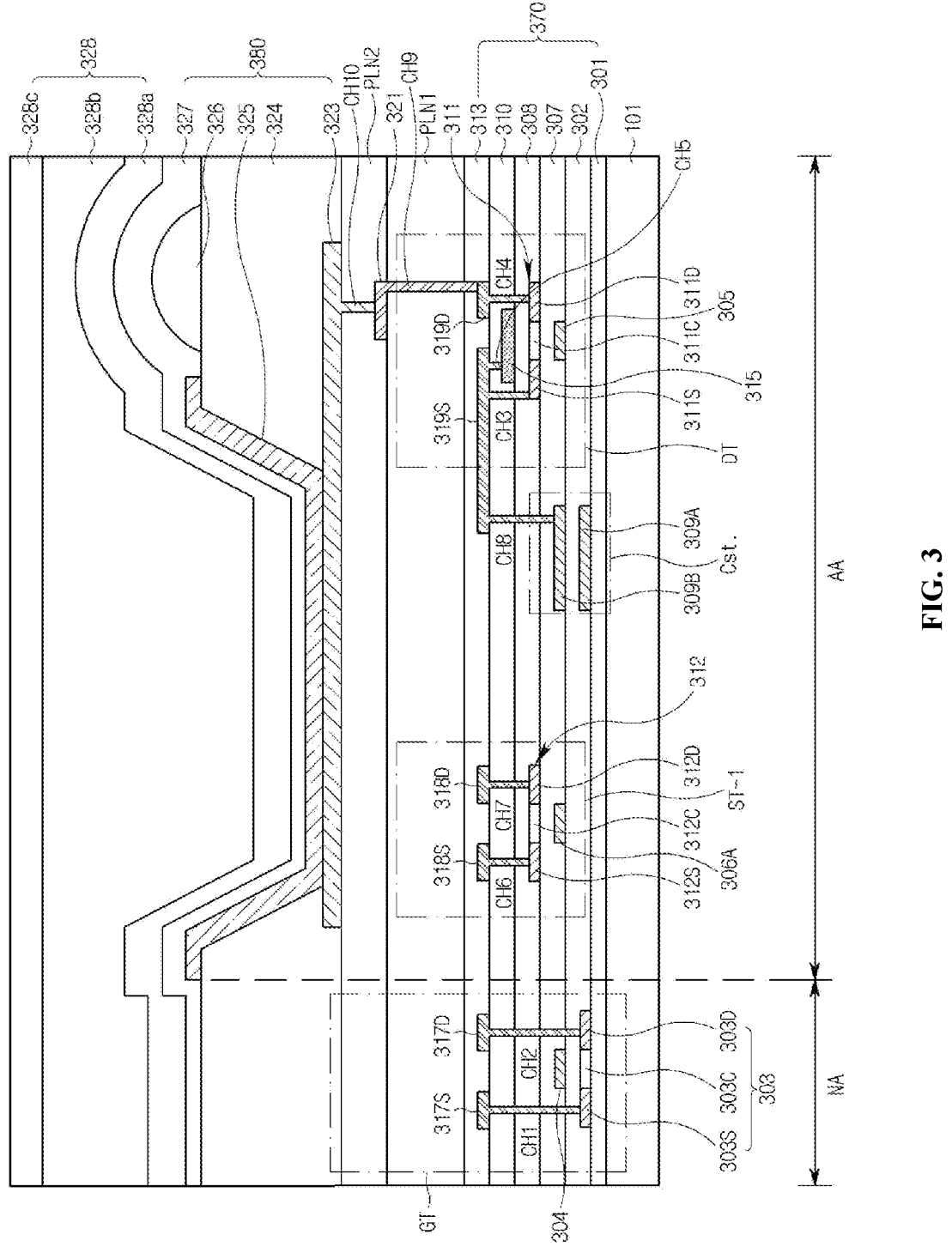
FIG. 3 is a cross-sectional view of one TFT disposed in a non-display area, and a driving TFT, a switching TFT, and a storage capacitor disposed in a pixel area according to an embodiment of the present disclosure.

FIG. 3 is a cross-sectional view showing a first TFT GT for driving a gate, which is disposed in a non-display area NA, in particular, in a gate driver to use a polycrystalline semiconductor pattern as an active layer, a driving TFT DT which is disposed in a sub-pixel PX and configured as an oxide TFT, a first switching TFT ST-1 and a storage capacitor Cst. But embodiments are not limited thereto. As an example, the active layer of the first TFT GT and the active layer of the driving TFT DT may be formed of the same or different materials.

Briefly describing the cross-sectional configuration of one sub-pixel PX, one sub-pixel PX may be divided into a pixel circuit portion 370 disposed on the substrate 101 and constituting the circuit of each sub-pixel, a light emitting element portion 380 electrically connected to the pixel circuit portion 370, and planarization layers PLN1 and PNL2 configured to separate the pixel circuit portion 370 and the light emitting element portion 380 from each other and planarize an upper surface of the pixel circuit portion 370. An encapsulation portion 328 and a touch panel portion (not shown) may be further disposed on the light emitting element portion 380.

Here, the pixel circuit portion 370 may refer to an array portion including the driving TFT DT, the first switching TFT ST-1, and the storage capacitor Cst to drive one sub-pixel PX. Also, the light emitting element portion 380 may refer to an array portion for emitting light, which includes an anode electrode, a cathode electrode, and a light emitting layer disposed between the anode electrode and the cathode electrode.

FIG. 3 illustrates one driving TFT DT, one switching TFT ST-1, and one storage capacitor Cst as an example of the pixel circuit portion 370.

In particular, in an embodiment of the present disclosure, the driving TFT DT and at least one switching TFT ST-1 may use an oxide semiconductor pattern as an active layer.

The oxide TFT may have an excellent effect of preventing a leakage current and relatively inexpensive manufacturing cost compared to polycrystalline TFTs. Therefore, according to the embodiment of the present disclosure, a driving TFT may be manufactured using an oxide semiconductor material, and at least one switching TFT may be also manufactured using the oxide semiconductor material.

The oxide semiconductors may be made of a metal oxide such as zinc (Zn), indium (In), gallium (Ga), tin (Sn), and titanium (Ti) or a combination of a metal such as zinc (Zn), indium (In), gallium (Ga), tin (Sn), or titanium (Ti) and its oxide. Specifically, the oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), indium zinc oxide (IZO), indium gallium tin oxide (IGTO), and indium gallium oxide (IGO), but is not limited thereto and the like.

In the pixel circuit portion of one sub-pixel, all TFTs may be configured as oxide TFTs or only some of them may be configured as oxide TFTs.

However, the oxide TFT is difficult to secure reliability, whereas the polycrystalline TFT has a high operating speed and excellent reliability. Therefore, an embodiment of the present disclosure shown in FIG. 3 will be described by taking, as an example, a case in which at least one of the switching TFTs and the driving TFT DT are manufactured using oxide TFTs, and the TFT constituting the gate driver is manufactured using a polycrystalline TFT.

However, the present disclosure is not limited to the embodiment shown in FIG. 3. That is, in the present disclosure, all TFTs constituting a sub-pixel may be configured using an oxide semiconductor, or all TFTs constituting a gate driver may be configured as a polycrystalline semiconductor pattern. Alternatively, the TFTs constituting the gate driver may be configured by including oxide TFTs and polycrystalline TFTs in a mixed manner.

The substrate 101 may be configured as a multi-layer in which organic layers and inorganic layers are alternately stacked. For example, the substrate 101 may be formed by alternately stacking organic films such as polyimide and inorganic films such as silicon oxide (SiO2). As another example, the substrate 101 may include a plastic material having flexibility so as to enable bending. For example, the substrate 101 may include a material such as polyimide (PI), polyethylene terephthalate (PET), polyethylene naphthalate (PEN), polycarbonate (PC), polyethersulfone (PES), polyarylate (PAR), polysulfone (PSF), or cyclic-olefin copolymer (COC).

A lower buffer layer 301 may be formed on the substrate 101. The lower buffer layer 301 is to prevent moisture from permeating from the outside, and may be formed by inorganic film in a single layer or in multiple layers, for example, the inorganic film in a single layer may be a silicon oxide (SiO$_x$) film or a silicon nitride (SiN$_x$) film, and inorganic films in multiple layers may formed by alternately stacking one or more silicon oxide (SiO$_x$) films, one or more silicon nitride (SiN$_x$) films, and one or more amorphous silicon (a-Si), but the present disclosure is not limited thereto.

A second buffer layer (not shown) may be further formed on the lower buffer layer 301 to protect TFTs disposed in the pixel circuit portion 370 from moisture permeation.

The first TFT GT may be formed in the non-display area NA on the substrate 101. The first TFT may be a polycrystalline TFT. The first TFT GT may include a polycrystalline semiconductor pattern 303 including a channel through which electrons or holes move, a first gate electrode 304, a first source electrode 317S, and a first drain electrode 317D.

The polycrystalline semiconductor pattern 303 may include a first channel region 303C disposed in the center thereof, and a first source region 303S and a first drain region 303D disposed with the first channel region 303C interposed therebetween.

The first source region 303S and the first drain region 303D may be formed by doping an intrinsic polycrystalline semiconductor pattern with impurity ions of Group V or Group III, for example, phosphorus (P) or boron (B) at a predetermined concentration.

The first channel region 303C, in which a polycrystalline semiconductor material is maintained in an intrinsic state, may provide a path through which electrons or holes move.

Meanwhile, the first TFT GT may include a first gate electrode 304 overlapping the first channel region 303C of the first polycrystalline semiconductor pattern 303. A first gate insulating layer 302 may be interposed between the first gate electrode 306 and the polycrystalline semiconductor pattern 303. For example, the first gate insulating layer 302 may be an inorganic layer. For example, the first gate insulating layer 302 may include $SiO_x$ or $SiN_x$.

In an embodiment of the present disclosure, the first TFT GT may adopt a top gate method in which the first gate electrode 304 is positioned over the polycrystalline semiconductor pattern 303. Since the first TFT GT adopts the top gate method, the second gate electrode 305 of the driving TFT DT which adopts a bottom gate method may be disposed in the same layer as the first gate electrode 304, thereby enabling manufacture using a single mask. However, the present disclosure is not limited thereto. For example, the first TFT GT may be a bottom gate type or a dual gate type.

The first gate electrode 304 may be made of a metal material. For example, the first gate electrode 306 may be a single layer or multiple layers made of any one of include molybdenum (Mo), aluminum (Al), chromium (Cr), gold (Au), titanium (Ti), nickel (Ni), neodymium (Nd), or copper (Cu) or an alloy thereof, but is not limited thereto.

A first interlayer insulating layer 307 may be deposited on the first gate electrode 304. The first interlayer insulating layer 307 may be made of silicon oxide (SiO2) or silicon nitride (SiNx). Alternatively, the first interlayer insulating layer 307 may be comprised of a plurality of stacked layers each of which is made of silicon oxide (SiO2) or silicon nitride (SiNx). In particular, the first interlayer insulating layer 307 may include a silicon nitride (SiNx) layer containing hydrogen particles.

When a heat treatment process is performed after forming the first semiconductor pattern 303 and the first interlayer insulating layer 307 is deposited on the first semiconductor pattern 303, the hydrogen particles included in the first interlayer insulating layer 307 may penetrate into the first source region 303S and the first drain region 303D to fill voids in the first semiconductor pattern 303 with hydrogen, thereby improving and stabilizing the conductivity of the polycrystalline semiconductor material. The above-described process may be also called a hydrogenation process.

The first source electrode 317S and the first drain electrode 317D may be disposed over the first interlayer insulating layer 307.

A plurality of inorganic insulating layers may be interposed between the first interlayer insulating layer 307 and the first source electrode 317S or first drain electrode 317D.

The first source electrode 317S or the first drain electrode 317D may be electrically connected to the first source region 303S and the first drain region 303D through a first contact hole CH1 and a second contact hole CH2, respectively. The first contact hole CH1 and the second contact hole CH2 may be formed to pass through the first interlayer insulating layer 307, a second interlayer insulating layer 308, the upper buffer layer 310 and first gate insulating layer 302.

In the embodiment of the present disclosure shown in FIG. 3, the first interlayer insulating layer 307 may function as a separation insulating film. That is, the driving TFT DT and the first switching TFT ST-1 each including an oxide semiconductor pattern on the first interlayer insulating layer 307 may be formed. Therefore, the first interlayer insulating layer 307 may serve as a separation insulating film that insulates the polycrystalline semiconductor pattern 303 and the oxide semiconductor pattern from each other.

When the first interlayer insulating layer 307 includes a silicon nitride (SiNx) layer containing hydrogen particles, the first interlayer insulating layer 307 may be comprised of a silicon nitride (SiNx) layer and a silicon oxide (SiO2) layer which are stacked in the order thereof. The hydrogen particles contained in the silicon nitride (SiNx) layer may contribute to making the polycrystalline semiconductor pattern conductive, but may reduce the oxide vacancy in the oxide semiconductor, resulting in reduction in reliability of the oxide semiconductor. Accordingly, when the oxide semiconductor pattern is formed on the first interlayer insulating layer 307, the stacking order of inorganic insulating layers may be changed such that the oxide semiconductor pattern is able to be directly formed on the silicon oxide (SiO2) layer.

The first source electrode 317S and the first drain electrode 317D may be a single layer or multiple layers made of any one of include molybdenum (Mo), aluminum (Al), chromium (Cr), gold (Au), titanium (Ti), nickel (Ni), neodymium (Nd), or copper (Cu) or an alloy thereof, but are not limited thereto.

Meanwhile, the driving TFT DT may be formed on the first interlayer insulating layer 307.

In one embodiment of the present disclosure, the driving TFT DT may include a first oxide semiconductor pattern 311. The first oxide semiconductor pattern 311 includes a channel region 311C, a source region 311S, and a drain region 311D. The source region 311S is at a first end of the channel region 311C, and the drain region 311D is at a second end of the channel region 311C that is opposite the first end in one embodiment. A source electrode 319S is connected to the source region 311S of the first semiconductor pattern 311. A drain electrode 319D is connected to the drain region 311D of the first semiconductor pattern 311. A gate electrode 305 overlaps a first side of the first semiconductor pattern 311. The dummy electrode 315 overlaps a second side of the first semiconductor pattern 311 that is opposite the first side of the first semiconductor pattern 311 in one embodiment.

Conventionally, a polycrystalline TFT, which is advantageous for high-speed operation, has been used as a driving TFT DT. However, the conventional polycrystalline TFT has a problem of large power consumption due to leakage current in an Off state. Therefore, in one embodiment of the present disclosure, a driving TFT DT using an oxide semiconductor pattern, which is advantageous for preventing a leakage current from occurring, as an active layer is proposed.

However, the oxide TFT is likely to have defects in a low grayscale region where precise current control is required because a variation value in current for a unit variation value in voltage is large due to the nature of the material of the oxide semiconductor. Accordingly, one embodiment of the present disclosure provides a driving TFT in which a variation value in current is relatively insensitive to a variation value in voltage applied to the gate electrode in an active layer.

Referring to FIG. 3, the driving TFT DT may include a first oxide semiconductor pattern 311 disposed on the first interlayer insulating layer 307, a second interlayer insulating layer 308 covering the first oxide semiconductor pattern 311, a second gate electrode 305 disposed under the first oxide semiconductor pattern 311 with the first interlayer insulating layer 307 interposed therebetween, a dummy electrode 315 disposed on the second interlayer insulating layer 308, a third interlayer insulating layer 310 covering the dummy electrode 315, and a second source electrode 319S and a second drain electrode 319D disposed on the third interlayer insulating layer 310.

The first oxide semiconductor pattern 311 may include a second channel region 311C disposed in the center thereof and a second source region 311S and a second drain region 311D disposed on both sides of the second channel region 311C and facing each other.

The second source electrode 319S and the second drain electrode 319D may be connected to the second source region 311S and the second drain region 311D through a third contact hole CH3 and a fourth contact hole CH4, respectively.

In particular, the dummy electrode 315 may be disposed over the first oxide semiconductor pattern 311 while partially overlapping the first oxide semiconductor pattern 311. Also, the dummy electrode 315 may be electrically connected to either the second source electrode 319S or the second drain electrode 319D.

The dummy electrode 315 may serve to protect the first oxide semiconductor pattern 311 from hydrogen particles that may be introduced from the upper portion of the first oxide semiconductor pattern 311. Accordingly, the dummy electrode 315 may include a titanium (Ti) material capable of collecting hydrogen particles. For example, the dummy electrode 315 may be a single layer of titanium, a double layer of molybdenum (Mo) and titanium (Ti), or an alloy of molybdenum (Mo) and titanium (Ti). However, the present disclosure is not limited thereto, and another metal layer including titanium (Ti) is also possible.

When the dummy electrode 315 is connected to either the second source electrode 319S or the second drain electrode 319D, the following additional effects may be obtained. (For convenience of description, the description will be given under assumption that the dummy electrode 315 is connected to the second source electrode)

A detailed description will be given with reference to FIGS. 4A and 4B.

Figure 4A:
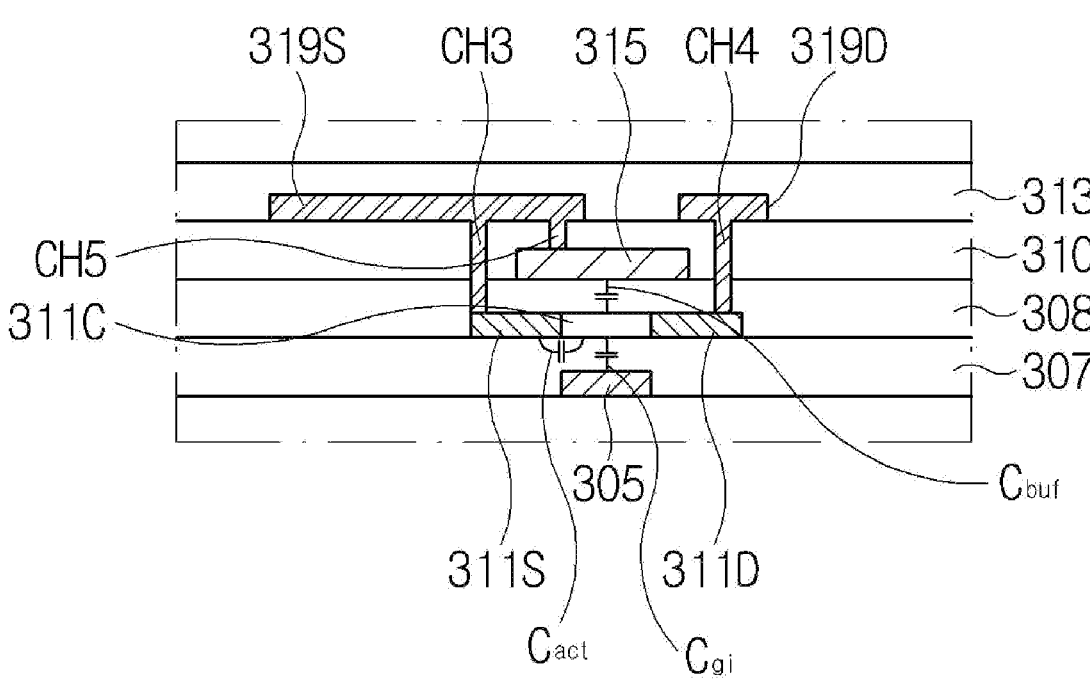
FIG. 4A is a cross-sectional view of a driving TFT according to an embodiment of the present disclosure.
Figure 4B:
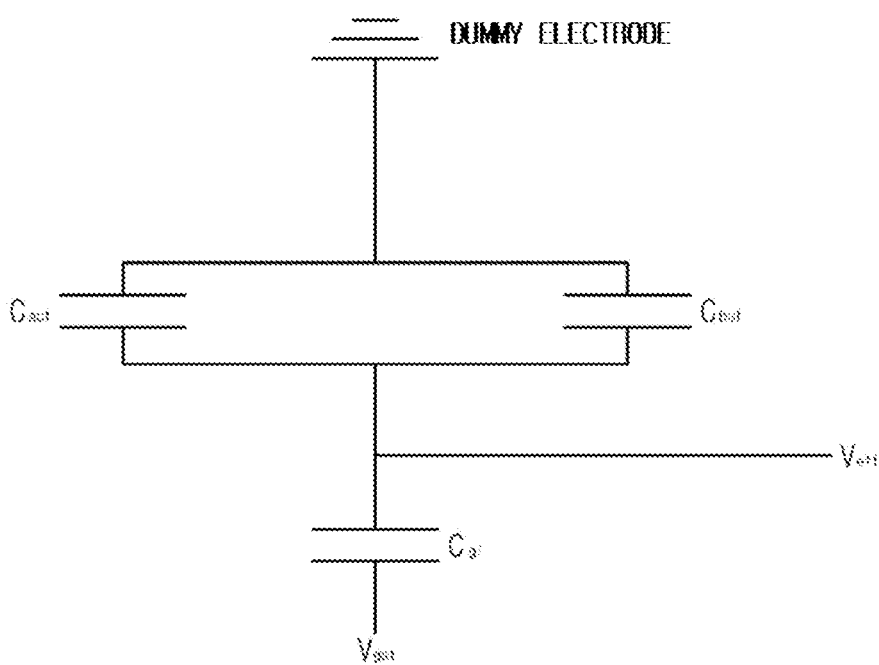
FIG. 4B is a circuit diagram showing a connection relationship between parasitic capacitors formed in a driving TFT according to the present disclosure.

FIG. 4A is a cross-sectional view of a driving TFT DT which is only separated from FIG. 3. FIG. 4B is a circuit diagram showing a relationship between a parasitic capacitance formed in the driving TFT DT and an applied voltage.

Referring to FIG. 4A, as the second source region 311S and the second drain region 311D are conductive in the first oxide semiconductor pattern 311, a parasitic capacitance Cact may be formed in the first oxide semiconductor pattern 311, a parasitic capacitance Cgi may be formed between the second gate electrode 305 and the first oxide semiconductor pattern 311, and a parasitic capacitance Cbuf may be formed between the dummy electrode 315 electrically connected to the second source electrode 319S and the first oxide semiconductor pattern 311.

Since the first oxide semiconductor pattern 311 and the dummy electrode 315 are electrically connected by the second source electrode 319S, the parasitic capacitance Cact and the parasitic capacitance Cbuf may be connected in parallel, and the parasitic capacitance Cact and the parasitic capacitance Cgi may be connected in series. Also, when a gate voltage Vgat is applied to the second gate electrode 305, an effective voltage Veff practically applied to the first oxide semiconductor pattern 311 is obtained by Equation 1 below.

$$\Delta V = Cgi/(Cgi + Cact + Cbuf) \times \Delta Vgat$$

Wherein, Cgi represents a parasitic capacitance between the second gate electrode 305 and the first oxide semiconductor pattern 311, Cact represents a parasitic capacitance in the first oxide semiconductor pattern 311, Cbuf represents a parasitic capacitance between the dummy electrode 315 and the first oxide semiconductor pattern 311, $\Delta Vgat$ represents a variation of voltage actually applied to the second gate electrode 305, and $\Delta V$ represents a variation of effective voltage Veff practically applied to the first oxide semiconductor pattern 311.

Therefore, since the effective voltage applied to the channel of the first oxide semiconductor pattern 311 is in inverse proportion to the parasitic capacitance Cbuf, the effective voltage applied to the first oxide semiconductor pattern 311 may be controlled by controlling the parasitic capacitance Cbuf.

That is, when the dummy electrode 315 is disposed close to the first oxide semiconductor pattern 311 to increase the parasitic capacitance Cbuf, an actual current flowing through the first oxide semiconductor pattern 311 may be reduced.

Reducing the effective current flowing through the first oxide semiconductor pattern 311 may mean that a control range of the driving TFT DT capable of being controlled through a voltage Vgat actually applied to the second gate electrode 305 is widened.

Accordingly, in the embodiment of the present disclosure referring to FIG. 3, the dummy electrode 315 is disposed closer to the first oxide semiconductor pattern 311 to widen a range in which the driving TFT DT controls a grayscale. As a result, it is possible to precisely control a light emitting element even in low grayscales, solving the problem of screen stains frequently occurring in low grayscales. Similarly, since the effective voltage applied to the channel of the first oxide semiconductor pattern 311 is in inverse proportion to the parasitic capacitance Cgi, the effective voltage applied to the first oxide semiconductor pattern 311 may be controlled by controlling the parasitic capacitance Cgi.

Therefore, in the present embodiment, the parasitic capacitance Cbuf may be greater than the parasitic capacitance Cgi.

Meanwhile, the first switching TFT ST-1 may include a second oxide semiconductor pattern 312 formed on the first interlayer insulating layer 307, a third gate electrode 306A disposed under the second oxide semiconductor pattern 312, a second interlayer insulating layer 308 and a third interlayer insulating layer 310 which cover the second oxide semiconductor pattern 312, and a third source electrode 318S and a third drain electrode 318D which are formed on the third interlayer insulating layer 310.

The second oxide semiconductor pattern 312 may include a third channel region 312C in the center thereof and a third source region 312S and a third drain region 312D disposed on both sides of the third channel region 312C.

The third source electrode 318S and the third drain electrode 318D may be connected to the third source region 312S and the third drain region 312D through a sixth contact hole CH6 and a seventh contact hole CH7, respectively.

In particular, the second gate electrode 305 and the third gate electrode 306A may be disposed under the first oxide semiconductor pattern 311 and the second oxide semiconductor pattern 312, respectively to protect the oxide semiconductor pattern from light introduced from the lower portion of the oxide semiconductor pattern.

Also, the first gate electrode 304, the second gate electrode 305, and the third gate electrode 306A may be disposed in the same layer, thus being formed simultaneously using a single mask. That is, mask processes may be reduced.

Meanwhile, the first source electrode 317S, the first drain electrode 317D, the second source electrode 319S, the second drain electrode 319D, the third source electrode 318S, and the third drain electrode 318D may be disposed in the same layer. That is, the source electrodes and the drain electrodes may be all disposed on the third interlayer insulating layer 310. Accordingly, the source electrodes and the drain electrodes may be simultaneously formed using one mask, thus reducing mask processes.

Meanwhile, referring to FIG. 3, one sub-pixel according to an embodiment of the present disclosure may further include a storage capacitor Cst.

The storage capacitor Cst may store a data voltage applied through a data line for a certain period of time and provide the data voltage to a light emitting element.

The storage capacitor Cst may include two electrodes corresponding to each other and a dielectric disposed between the two electrodes. The storage capacitor Cst may include a first electrode 309A of the storage capacitor made of the same material as the first polycrystalline semiconductor pattern 303 and having conductivity and a second electrode 309B of the storage capacitor made of the same material as the first gate electrode 304 and disposed in the same layer as the first electrode 309A.

A first gate insulating layer 302 may be interposed between the first electrode 309A of the storage capacitor and the second electrode 309B of the storage capacitor.

The second electrode 309B of the storage capacitor Cst may be electrically connected to the second source electrode 319S through an eighth contact hole CH8 which may be formed to pass through the first interlayer insulating layer 307, a second interlayer insulating layer 308 and the upper buffer layer 310.

Meanwhile, the contact holes, that is, the first contact hole CH1 to the eighth contact hole CH8 may be simultaneously formed using one mask. As a result, it is possible to reduce the use of multiple masks and shorten a process for forming a plurality of different contact holes.

The first contact hole CH1 to the eighth contact hole CH8 are simultaneously formed using one mask, so that the first source electrode 317S, the first drain electrode 317D, the second source electrode 319S, and the second drain electrode 319D are simultaneously formed on the third interlayer insulating layer 310. Due to this, the number of masks may be reduced and the process may be shortened.

The configuration of the pixel circuit portion 370 constituting the sub-pixel according to the embodiment of the present disclosure has been described above. Since the pixel circuit portion 370 according to an embodiment of the present disclosure is comprised of a plurality of TFTs including different types of semiconductor materials, the pixel circuit portion 370 have a plurality of layers, resulting in a necessity to use of many masks. Therefore, it can be seen that an embodiment of the present disclosure has a configuration in which a plurality of layers is simultaneously formed so as to reduce the number of masks used.

That is, the first semiconductor pattern 303 constituting the first TFT GT and the first electrode 309A of the storage capacitor may be simultaneously formed in the same layer.

Further, the first gate electrode 304, the second gate electrode 305, the third gate electrode 306A, and the second electrode 309B of the storage capacitor may be simultaneously formed in the same layer.

Also, the first oxide semiconductor pattern 311 and the second oxide semiconductor pattern 312 may be simultaneously formed in the same layer.

In addition, the first source electrode 317S, the first drain electrode 317D, the second source electrode 319S, the second drain electrode 319D, the third source electrode 318S, and the third drain electrode 318D may be simultaneously formed in the same layer.

Meanwhile, referring to FIG. 3, a first planarization layer PLN1 and a second planarization layer PLN2 may be sequentially formed over the pixel circuit portion 370 to planarize the upper portion of the pixel circuit portion 370. A fourth interlayer insulating layer 313 may be further formed before the first planarization layer PLN1 is formed. However, the fourth interlayer insulating layer 313 may not be essentially formed.

The light emitting element portion 380 may include a first electrode 323 as an anode electrode, a second electrode 327 as a cathode electrode corresponding to the first electrode 323, and a light emitting layer 325 interposed between the first electrode 323 and the second electrode 327. The first electrode 323 may be formed for each sub-pixel, that is, each sub-pixel of a plurality of sub-pixels each has a first electrode 323, and the plurality of sub-pixels have a second electrode 327 in common, but the present disclosure is not limited thereto. For example, the light emitting layer 325 may also be implemented as an inorganic light emitting device layer such as micro-LED.

Meanwhile, the light emitting element portion 380 may be connected to the pixel circuit portion 370 through a connection electrode 321 formed on the first planarization layer PLN1. In particular, the first electrode 323 of the light emitting element portion 380 and the second drain electrode 319D of the driving TFT DT constituting the pixel circuit portion 370 may be electrically connected to each other via the connection electrode 321 which is filled in a ninth contact hole CH9 which is formed to pass through the fourth interlayer insulating layer 313 and the first planarization layer PLN1.

The first electrode 323 may be connected to the connection electrode 321 through a tenth contact hole CH10 passing through the second planarization layer PLN2.

The first electrode 323 may have a multilayer structure including a transparent conductive film and an opaque conductive film having high reflective efficiency. The transparent conductive film may be made of a material having a relatively high work function value such as indium-tin-oxide (ITO) or indium-zinc-oxide (IZO), and the opaque conductive film may have a single-layer or multi-layer structure including Al, Ag, Cu, Pb, Mo, Ti or an alloy thereof. For example, the first electrode 323 may have a structure in which the transparent conductive film and the opaque conductive film, and the transparent conductive film are sequentially stacked, or a structure in which the transparent conductive film and the opaque conductive film are sequentially stacked. The first electrode 323 may supply holes to the emitting layer 325. The type of the first electrode 323 is not particularly limited as long as it can supply holes to the emitting layer 325.

The light emitting layer 325 may be formed by stacking a hole-related layer, an organic light emitting layer, and an electron-related layer on the first electrode 323 in the order or reverse order thereof. For example, the light-emitting layer 325 may include one or more of a hole injection layer (HIL), a hole transmitting layer (HTL), an electron transmitting layer (ETL) and an electron injection layer (EIL), but the present disclosure is not limited thereto.

A bank layer 324 may be a pixel-defining film exposing the first electrode 323 of each sub-pixel. The bank layer 324 may be made of an opaque material (e.g., black) to prevent optical interference between adjacent sub-pixels. In this case, the bank layer 324 may include a light blocking material made of at least one of color pigment, organic black, and carbon. A spacer 326 may be further disposed on the bank layer 324. The spacer 326 may ensure a gap between a fine metal mask (FMM) and the first electrode 323 so that the FMM is not in contact with the first electrode 323 in a deposition process of the emitting layer 325.

The second electrode 327, which is a cathode electrode, may face the first electrode 323 with the light emitting layer 325 interposed therebetween and may be formed on the upper surface and side surfaces of the light emitting layer 325. The second electrode 327 may be integrally formed on the entire surface of an active area. When applied to a top light emitting type organic light emitting display device, the second electrode 327 may be made of a transparent conductive layer such as indium-tin-oxide (ITO) or indium-zinc-oxide (IZO).

The encapsulation portion 328 for suppressing moisture permeation may be disposed on the second electrode 327.

The encapsulation portion 328 may include a first inorganic encapsulation layer 328a, a second organic encapsulation layer 328b, and a third inorganic encapsulation layer 328c sequentially stacked.

The first inorganic encapsulation layer 328a and the third inorganic encapsulation layer 328c may be made of an inorganic material such as silicon oxide (SiOx). The second organic encapsulation layer 328b may be made of an organic material such as acrylic resin, epoxy resin, phenolic resin, polyamide resin, and polyimide resin. Materials of the first inorganic encapsulation layer 328a, the second organic encapsulation layer 328b and the third inorganic encapsulation layer 328c are not limited thereto.

Meanwhile, the encapsulation portion 328 is not limited to three layers, for example, the encapsulation portion 328 may include n layers alternately stacked between inorganic encapsulation layer and organic encapsulation layer (where n is an integer greater than 3).

Although not shown in FIG. 3, a touch panel may be further disposed over the encapsulation portion 328.

In the above, with reference to FIG. 3, the first embodiment of the present disclosure has been described which includes the driving TFT DT including an oxide semiconductor pattern, the switching TFT ST-1 using an oxide semiconductor pattern, and the first TFT GT disposed in the GIP area of the non-display area NA and including a polycrystalline semiconductor pattern, among the plurality of TFTs disposed in the sub-pixel of the display area AA.

However, in the present disclosure, switching TFTs having different structures may be disposed in the sub-pixel.

Hereinafter, a case in which a first switching TFT ST-1 and a second switching TFT ST-2 having different structures will be described with reference to FIG. 5.

A description for the same configuration as that of the first embodiment of the present disclosure with reference to FIG.

3 will be omitted and differences from the first embodiment of the present disclosure will be mainly described below.

Figure 5:
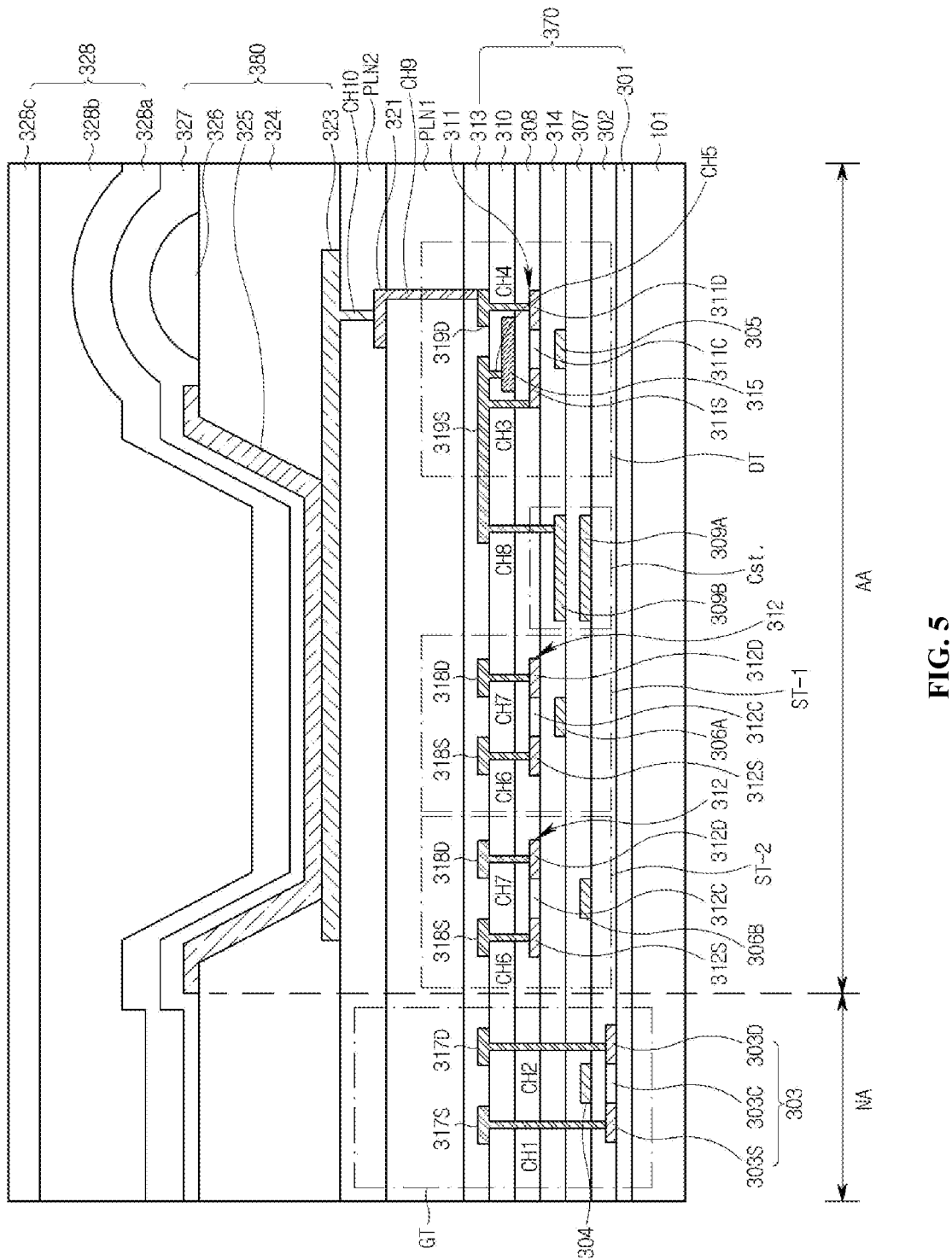
FIG. 5 is a cross-sectional view of a driving TFT disposed in a pixel area and two switching TFTs having different structures according to an embodiment of the present disclosure.

Referring to FIG. 5, a first TFT GT disposed in a non-display area NA may be the same as that of the first embodiment referring to FIG. 3. Also, a driving TFT DT disposed in a sub-pixel of a display area AA may have the same configuration as that of the first embodiment with reference to FIG. 3.

Referring to FIG. 2, the sub-pixel may include an internal compensation circuit including a plurality of switching TFTs. Among them, the second switching TFT T3 connected to the gate node of the driving TFT DT may operate very sensitively to a driving voltage compared to other switching TFTs, causing initial luminance imbalance in the sub-pixel. To solve this problem, it is necessary to increase a threshold voltage of the second switching TFT T3.

Therefore, the internal compensation circuit of the present disclosure may include a second switching TFT ST-2 having a high threshold voltage among the switching TFTs.

Referring to FIG. 5, the first switching TFT ST-1 may represent a switching TFT whose threshold voltage is not controlled, and the second switching TFT ST-2 may have a structure in which a threshold voltage is higher than that of the first switching TFT ST-1.

In an oxide TFT, a parasitic capacitance may be formed between the gate electrode and the active pattern of the oxide TFT. As a distance between the gate electrode and the active pattern increases, the parasitic capacitance decreases and, as a result, the threshold voltage increases.

Therefore, referring to FIG. 5, a fourth gate electrode 306B of the second switching TFT ST-2 may be positioned further away from an oxide semiconductor pattern 312, compared to the third gate electrode 306A of the first switching TFT ST-1.

That is, the fourth gate electrode 306B may be disposed on the first gate insulating layer 302 which is the same layer as a layer on which the first gate electrode 304 is disposed, and the third gate electrode 306A may be disposed on a first interlayer insulating layer 307 deposited on the first gate insulating layer 302. Further, the second oxide semiconductor pattern 312 may be disposed on the second gate insulating layer 314 deposited on the first interlayer insulating layer 307. Therefore, a distance between the second oxide semiconductor pattern 312 and the fourth gate electrode 306B in the second switching TFT ST-2 may be configured to be longer than a distance between the second oxide semiconductor pattern 312 and the third gate electrode 306A in the first switching TFT ST-1.

For reference, elements having the same configuration through the first switching TFT ST-1 and the second switching TFT ST-2 are denoted by the same reference numerals for convenience of description.

The second switching TFT ST-2 may be an example of a sampling switching transistor connected to the gate node of the driving TFT DT, and the first switching TFT may be an example of other switching TFTs.

In addition, in a second embodiment of the present disclosure referring to FIG. 5, the storage capacitor Cst may include a first electrode 309A of the storage capacitor disposed in the same layer as the fourth gate electrode 306B and a second electrode 309B of the storage capacitor disposed on the first interlayer insulating layer 307.

The fourth gate electrode 306B and the first electrode 309A of the storage capacitor may be formed on the first gate insulating layer 302 using one mask.

In addition, the second gate electrode 305 of the driving TFT DT, the third gate electrode 306A of the first switching TFT ST-1, and the second electrode 309B of the storage capacitor may be formed on the first interlayer insulating layer 307 using one mask.

Referring to FIG. 5, as a result, all of the TFTs disposed in the sub pixel may have a bottom gate structure in which a gate electrode is disposed under an active pattern.

Meanwhile, the switching TFT in the sub-pixel of the present disclosure may have a dual gate structure.

Figure 6:
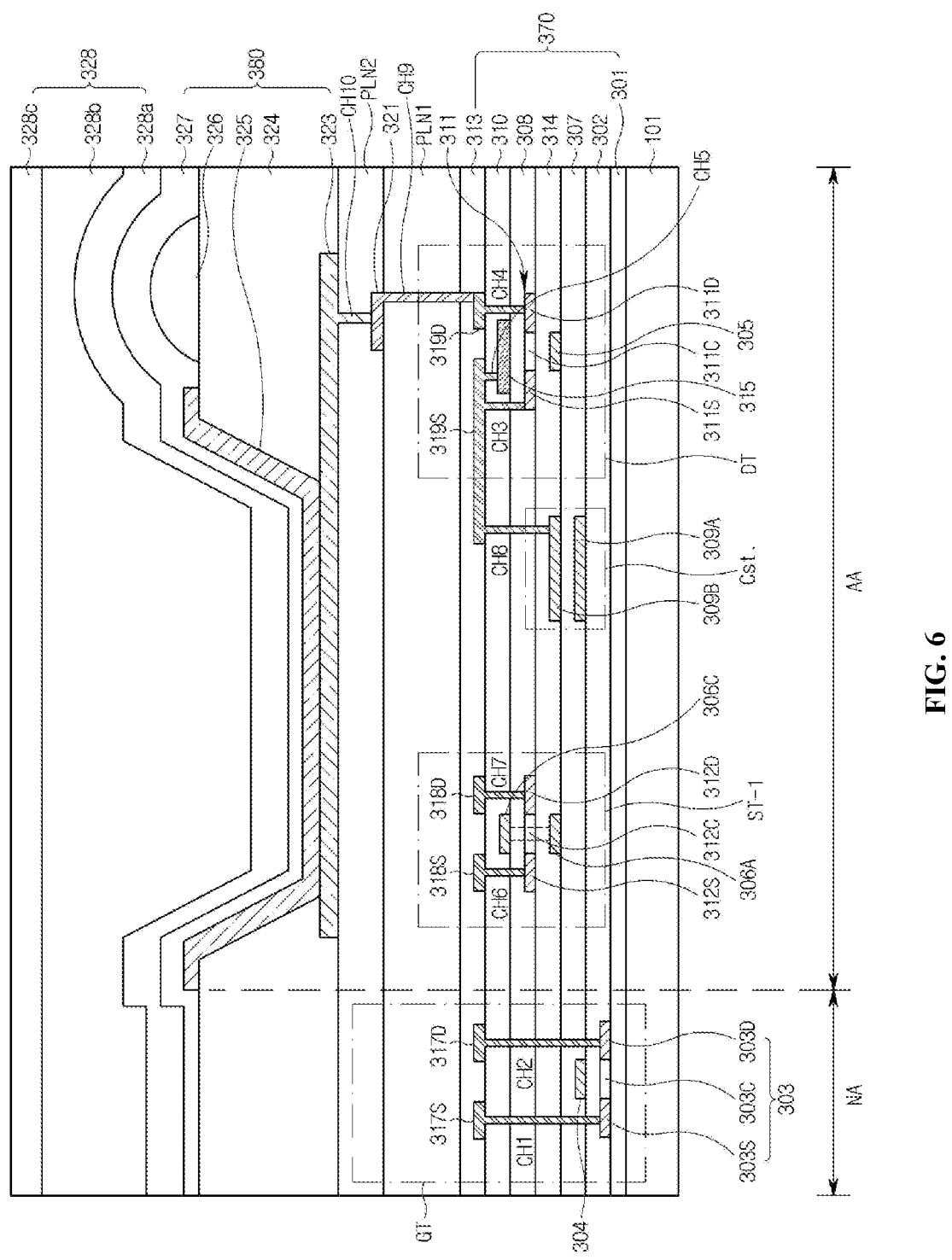
FIG. 6 is a cross-sectional view of a display device including a switching TFT having a dual gate structure according to an embodiment of the present disclosure.

Referring to FIG. 6, the switching TFT may have a dual gate structure having gate electrodes respectively disposed over and under an active pattern.

Referring to FIG. 6, the configurations of the first TFT GT, the storage capacitor Cst, and the driving TFT DT may be the same as those of the sub-pixel shown in FIG. 5, and thus the descriptions thereof will be omitted.

Although only one switching TFT is shown in FIG. 6 for convenience of description, all of the switching TFTs in a sub-pixel may have the same structure. However, as shown in FIG. 5, switching TFTs having different structures may be disposed together in one sub-pixel.

Referring to FIG. 6, it will be described that the first switching TFT ST-1 constituting the sub-pixel may have a dual gate structure.

The first switch TFT ST-1 may include a third gate electrode 306A disposed under the second oxide semiconductor pattern 312 and a fifth gate electrode 306C disposed above the second oxide semiconductor pattern 312. In some embodiments, the third gate electrode 306A overlaps a first side of the second oxide semiconductor pattern 312, and the fifth gate electrode 306C overlaps a second side of the second oxide semiconductor pattern 312 that is opposite the first side of the second oxide semiconductor pattern 312. The third gate electrode 306A and the fifth gate electrode 306C may be electrically connected to each other.

When the switching TFT is configured to have a dual-gate structure, channel mobility may be increased, more current may flow, and stability of the TFT can be improved by protecting the active layer from external light.

A plurality of switching TFTs are disposed in the sub-pixel, and all remaining switching TFTs except for the driving TFT DT in the sub-pixel may be manufactured to have a dual gate structure.

In addition, all switching TFTs in the sub-pixel may have a dual gate structure even when some switching TFTs are configured to have the same structure as the first switching TFT ST-1 and some other switching TFTs are configured have the same structure as the second switching TFT ST-2 in the sub-pixel, as shown in FIG. 5.

Referring to FIG. 6, the third gate electrode 306A may be made of the same material in the same layer as the second gate electrode 305 of the driving TFT DT. That is, the third gate electrode 306A and the second gate electrode 305 may be formed on the first interlayer insulating layer 307.

Also, the fifth gate electrode 306C and the dummy electrode 315 may be made of the same material in the same layer. That is, the fifth gate electrode 306C and the dummy electrode 315 may be formed on the second interlayer insulating layer 308.

In this way, the third gate electrode 306A and the second gate electrode 305 may be simultaneously formed using one mask, and the fifth gate electrode 306C and the dummy electrode 315 may be simultaneously formed using one mask, thus shortening the process.

Figure 7:
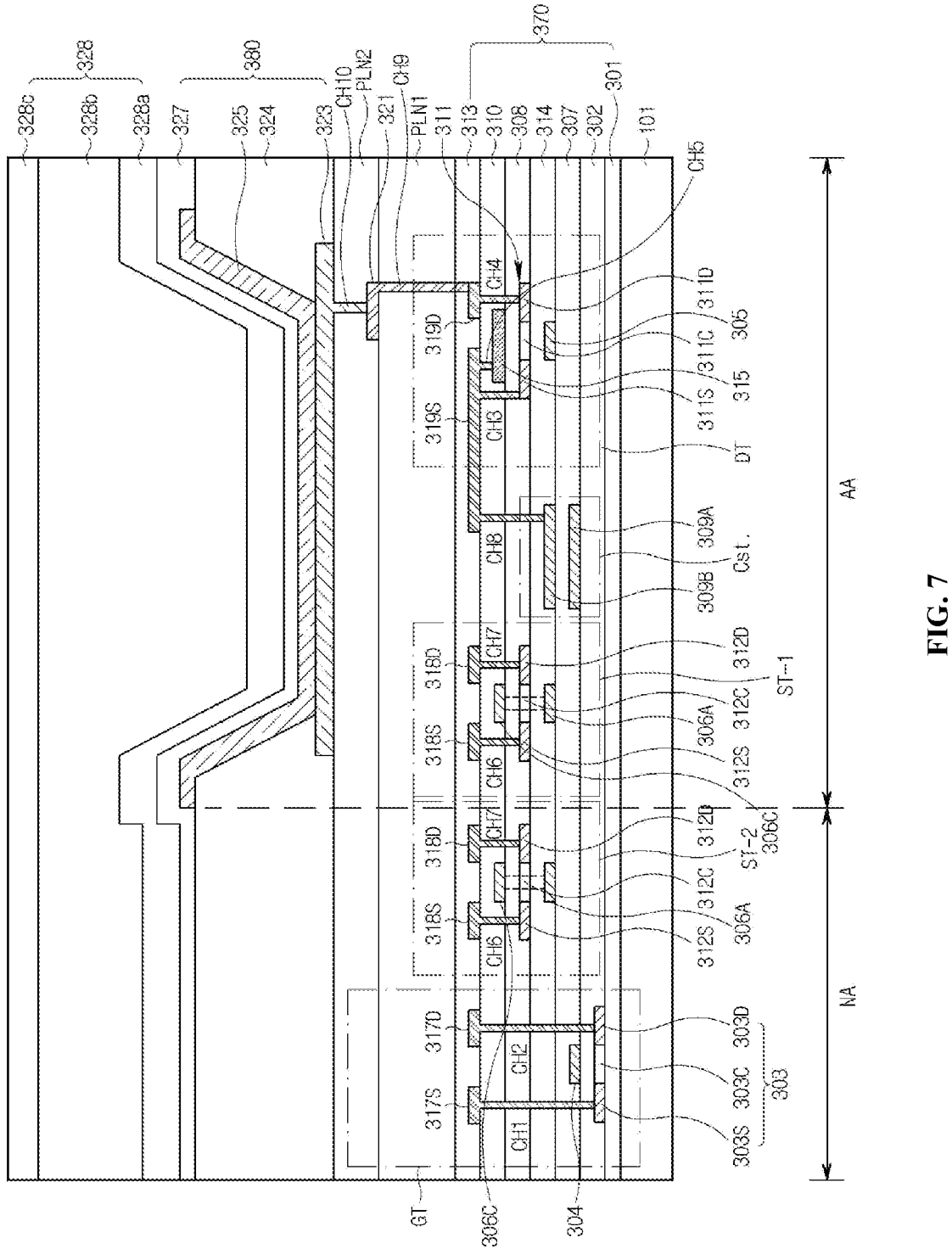
FIG. 7 is a cross-sectional view of a display device in which a TFT including a polycrystalline semiconductor pattern and a TFT including an oxide semiconductor pattern constitute a CMOS according to an embodiment of the present disclosure.

Meanwhile, referring to FIG. 7, some TFTs disposed in the non-display area NA of the present disclosure may be configured as a CMOS. That is, referring to FIG. 7, a first TFT GT, which is P-type, including a polycrystalline semi-conductor pattern and the third switching TFT ST-3, which is N-type, including an oxide semiconductor pattern may be complementary to each other, thus constituting a CMOS.

The third switching TFT ST-3 may have the same structure as the first switching TFT ST-1.

FIG. 7 illustrates the third switching TFT ST-3 having the same structure as the first switching TFT ST-1 having a dual gate structure shown in FIG. 6. However, the third switching TFT ST-3 may also have a single gate structure like the first switching TFT ST-1 shown in FIG. 5.

Figure 8:
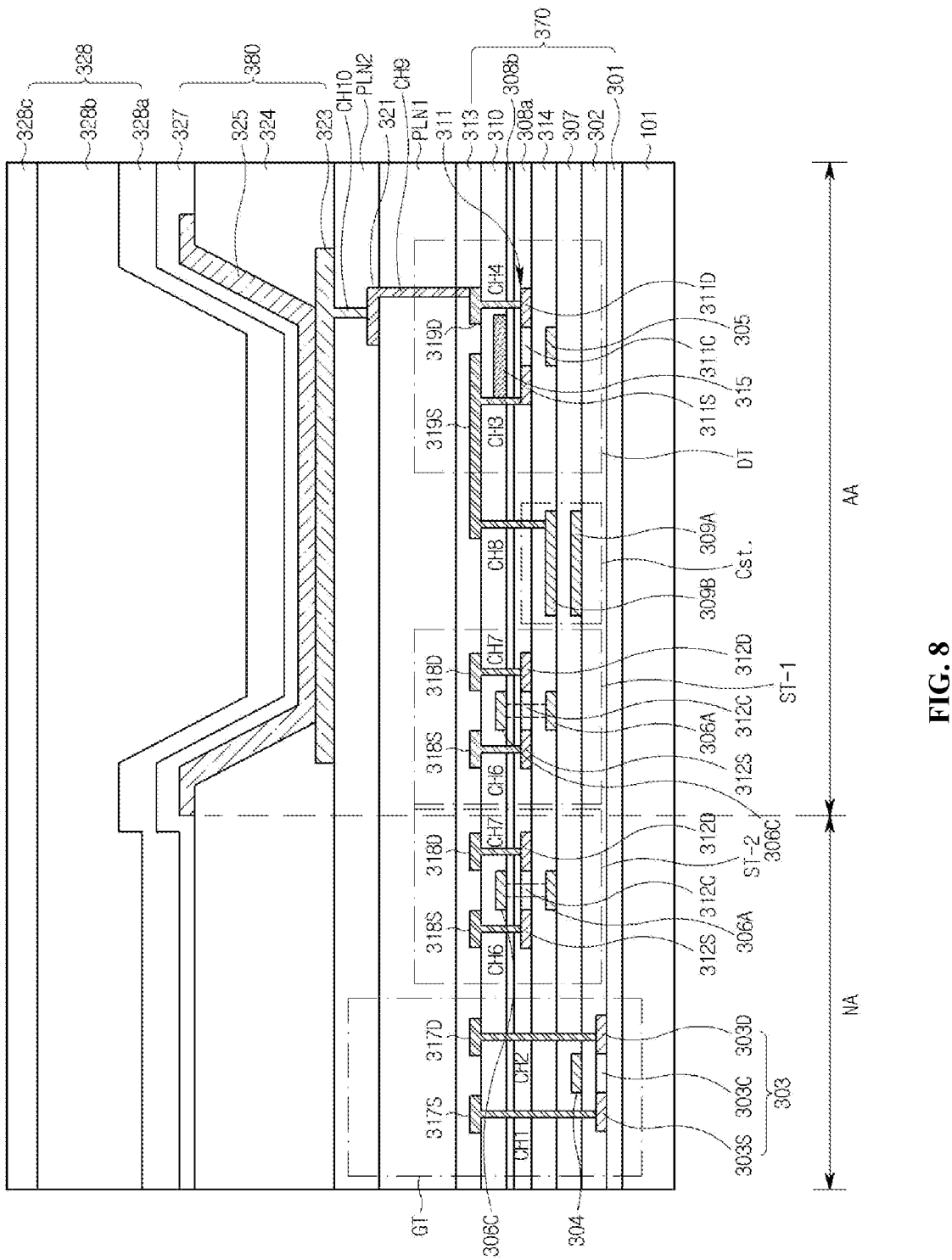
FIG. 8 is a cross-sectional view of a display device using an inorganic insulating layer having a high dielectric constant as an interlayer insulating layer of a driving TFT according to an embodiment of the present disclosure.

Also, referring to FIG. 8, the second interlayer insulating layer 308 disposed between the first oxide semiconductor pattern 311 and the dummy electrode 315 may be comprised of a plurality of inorganic insulating layers having high permittivity.

Meanwhile, referring to FIG. 8, the second interlayer insulating layer 308 may be comprised of stacked layers including a first sub-second interlayer insulating layer 308a made of a silicon oxide film (SiO2) and a second sub-second interlayer insulating layer 308b made of a fluorine silicon nitride film (SiN:F). The silicon oxide film (SiO2) may have a dielectric constant of about 4.5, whereas the fluorine silicon nitride film (SiN:F) may have a dielectric constant of about 7. Accordingly, when the second interlayer insulating layer 308 is comprised of multiple layers including fluorine silicon nitride (SiN:F), the second interlayer insulating layer 308 may have a higher dielectric constant compared to a case where the second interlayer insulating layer 308 is comprised of a single layer of silicon oxide (SiO2). That is, when the second interlayer insulating layer 308 is comprised of stacked layers of a silicon oxide (SiO2) film and a fluorine silicon nitride (SiN:F) film rather than a single layer of the silicon oxide (SiO2) film to form the second interlayer insulating layer 308, the thickness of the insulating film may be reduced.

In addition, the fluorine silicon nitride (SiN:F) film has a low oxygen content in the insulating film and is suitable for being deposited on an oxide semiconductor pattern that is vulnerable to oxygen particles.

Reducing the thickness of the second interlayer insulating layer 308 may increase the parasitic capacitance Cbuf, as known from Equation 1, and consequently increase an S-factor.

Meanwhile, referring to FIG. 8, the second source electrode 319S may be connected to the second source region 311S through the third contact hole CH3. In addition, the second source electrode 319S may be also electrically connected to the dummy electrode 315. In this case, referring to FIG. 8, the second source electrode 319S may be configured in a side contact method in which the second source electrode 319S contacts the side surface of the dummy electrode 315 such that the second source electrode 319S are simultaneously connected to the second source region 311S and the dummy electrode 315 through one contact hole, that is, the third contact hole CH3. With the above configuration, the area in which the dummy electrode 315 overlaps the first oxide semiconductor pattern 311 may be increased. Also, the number of contact holes may be reduced.

The above description and accompanying drawings are merely illustrative of the technical idea of the present disclosure, and various modifications and variations, such as combination, separation, substitution and change of configurations, may be made without departing from the essential characteristics of the present disclosure by those skilled in the art to which the present disclosure pertains. Therefore, the embodiments of the present disclosure are provided for illustrative purposes only but not intended to limit the technical spirit of the present disclosure, and the scope of the technical idea of the present disclosure is not limited by these embodiments. The scope of protection of the present disclosure should be interpreted by the following claims, and all technical ideas within the scope equivalent thereto should be construed as being included in the scope of the present disclosure.

| REFERENCE NUMERALS | |
| --- | --- |
| 100: display device | 101: substrate |
| 103: gate driver | 104: data driver |
| 370: pixel circuit portion | 380: light emitting element portion |
| 328: encapsulation portion | |
| ST-1, ST-2, and ST-3: first to third switching TFT | |
| Cst: storage capacitor | DT: driving TFT |
| 317S, 318S, and 319S: source electrodes | 317D, 318D, and 319D: gate electrode |
| 304: first gate electrode | 305: second gate electrode |
| 306A: third gate electrode | 306B: fourth gate electrode |
| 306C: fifth gate electrode | |
| 303: polycrystalline semiconductor pattern | |
| 311 and 312: oxide semiconductor pattern | 315: dummy electrode |

What is claimed is:

1. A thin film transistor, comprising:
a semiconductor pattern including a channel region, a source region at a first end of the channel region, and a drain region at a second end of the channel region that is opposite the first end;
a gate electrode overlapping the channel region, the gate electrode under the semiconductor pattern;
a source electrode and a drain electrode over the semiconductor pattern, the source electrode connected to the source region of the semiconductor pattern and the drain electrode connected to the drain region of the semiconductor pattern; and
a dummy electrode over the semiconductor pattern and overlapping the semiconductor pattern, the dummy electrode connected to either the source electrode or the drain electrode;
a gate insulating layer including at least one inorganic insulating layer, the gate insulating layer between the gate electrode and the semiconductor pattern; and
a first interlayer insulating layer including at least one inorganic insulating layer, the first interlayer insulating layer between the semiconductor pattern and the dummy electrode,
wherein the gate insulating layer has a thickness that is greater than a thickness of the first interlayer insulating layer.

2. The thin film transistor of claim 1, wherein the semiconductor pattern comprises an oxide semiconductor pattern.

3. The thin film transistor of claim 1,
wherein the first interlayer insulating layer has a dielectric constant that is greater than a dielectric constant of the gate insulating layer.

4. The thin film transistor of claim 3, wherein the gate insulating layer comprises a silicon oxide thin film, and the first interlayer insulating layer comprises a fluorine silicon nitride film having a dielectric constant that is greater than a dielectric constant of the silicon oxide thin film.

5. The thin film transistor of claim 1, wherein the dummy electrode comprises a conductive metal pattern.

6. The thin film transistor of claim 1, wherein the source electrode is connected to the source region and the dummy electrode through a contact hole, and an edge of the dummy electrode is in contact with a portion of the source electrode that passes through the contact hole.

7. The thin film transistor of claim 1, wherein a parasitic capacitance between the dummy electrode and the semiconductor pattern is greater than a parasitic capacitance between the semiconductor pattern and the gate electrode.

8. A display device comprising:
a substrate including a display area and a non-display area adjacent to the display area;
a first thin film transistor (TFT) on the substrate, the first TFT including a first semiconductor pattern, a first gate electrode, and a first source electrode and a first drain electrode over the first semiconductor pattern;
a second TFT on the substrate, the second TFT including a second semiconductor pattern in a different layer from the first semiconductor pattern, a second gate electrode under the second semiconductor pattern, and a second source electrode and a second drain electrode over the second semiconductor pattern;
a dummy electrode connected to either the second source electrode or the second drain electrode, the dummy electrode overlapping the second semiconductor pattern; and
a third TFT including a third semiconductor pattern in a same layer as the second semiconductor pattern, a third gate electrode under the third semiconductor pattern, and a third source electrode and a third drain electrode over the third semiconductor pattern.

9. The display device of claim 8, wherein the first gate electrode and the second gate electrode are in a same layer.

10. The display device of claim 8, further comprising:
a storage capacitor including a first electrode of the storage capacitor and a second electrode of the storage capacitor, the first electrode of the storage capacitor in a same layer as the first gate electrode, and the second electrode of the storage capacitor over the first electrode of the storage capacitor,
wherein the second gate electrode is in a same layer as the second electrode of the storage capacitor.

11. The display device of claim 8, further comprising:
a gate insulating layer between the second gate electrode and the second semiconductor pattern, the gate insulating layer including at least one inorganic insulating layer; and
a first interlayer insulating layer between the second semiconductor pattern and the dummy electrode, the first interlayer insulating layer including at least one inorganic insulating layer, wherein the gate insulating layer has a thickness that is greater than a thickness of the first interlayer insulating layer.

12. The display device of claim 8, further comprising:
a gate insulating layer between the second gate electrode and the second semiconductor pattern, the gate insulating layer including at least one inorganic insulating layer; and
a first interlayer insulating layer between the second semiconductor pattern and the dummy electrode, the first interlayer insulating layer including at least one inorganic insulating layer,
wherein the first interlayer insulating layer has a dielectric constant that is greater than a dielectric constant of the gate insulating layer.

13. The display device of claim 12, wherein the gate insulating layer includes a silicon oxide thin film, and the first interlayer insulating layer includes a fluorine silicon nitride film having a dielectric constant that is greater than a dielectric constant of the silicon oxide thin film.

14. The display device of claim 8, wherein the first TFT is in the non-display area, and the second TFT is in the display area.

15. The display device of claim 8, wherein a first parasitic capacitance between the dummy electrode and the second semiconductor pattern is greater than a second parasitic capacitance between the second semiconductor pattern and the second gate electrode.

16. The display device of claim 8, further comprising:

a fourth TFT including a fourth semiconductor pattern in the same layer as the second semiconductor pattern, a fourth gate electrode under the fourth semiconductor pattern, and a fourth source electrode and a fourth drain electrode over the fourth semiconductor pattern, wherein the third gate electrode and the fourth gate electrode are in different layers from each other.

17. The display device of claim 16, wherein the first semiconductor pattern includes a polycrystalline semiconductor pattern, and at least one of the second semiconductor pattern, the third semiconductor pattern, or the fourth semiconductor pattern includes an oxide semiconductor pattern.

18. The display device of claim 8, further comprising:

a fifth gate electrode over the third semiconductor pattern, the fifth gate electrode electrically connected to the third gate electrode.

19. A display device, comprising:

a substrate having an active area that displays an image and a non-active area that does not display the image;

a light emitting element on the active area, the light emitting element including a first electrode, a light emitting layer on the first electrode, and a second electrode on the light emitting layer;

a first thin film transistor that is connected to the light emitting element, the first thin film transistor comprising:

a first semiconductor pattern including a first channel region, a first source region at a first end of the first channel region, and a first drain region at a second end of the first channel region that is opposite the first end;

a first gate electrode overlapping a first side of the first semiconductor pattern;

a first source electrode connected to the first source region of the first semiconductor pattern;

a first drain electrode connected to the first drain region of the first semiconductor pattern; and a dummy electrode overlapping a second side of the first semiconductor pattern that is opposite the first side of the first semiconductor pattern, the dummy electrode connected to either the first source electrode or the first drain electrode; and a second thin film transistor on the non-active area, the second thin film transistor comprising:

a second semiconductor pattern in a different layer from the first semiconductor pattern, the second semiconductor pattern including a second channel region, a second source region at a first end of the second channel region, and a second drain region at a second end of the second channel region that is opposite the first end of the second channel region;

a second gate electrode overlapping the second semiconductor pattern;

a second source electrode connected to the second source region of the second semiconductor pattern; and a second drain electrode connected to the second drain region of second first semiconductor pattern.

20. The display device of claim 19, further comprising:

a storage capacitor comprising a first electrode and a second electrode, wherein the first electrode of the storage capacitor and the first gate electrode of the first thin film transistor are in a same layer, and the first electrode is electrically connected to the first source electrode of the first thin film transistor.

21. The display device of claim 19, further comprising a third thin film transistor, the third thin film transistor comprising:

a third semiconductor pattern including a third channel region, a third source region at a first end of the third channel region, and a third drain region at a second end of the third channel region that is opposite the first end of the third channel region;

a third gate electrode overlapping a first side of the third semiconductor pattern;

a third source electrode connected to the third source region of the third semiconductor pattern; and a third drain electrode connected to the third drain region of the third semiconductor pattern, wherein the first semiconductor pattern and the third semiconductor pattern are in a same layer and the first source electrode and the first drain electrode of the first thin film transistor are in a same layer as the third source electrode and the third drain electrode of the third thin film transistor.

22. The display device of claim 21, wherein the third thin film transistor further comprises:

a second gate electrode overlapping a second side of the third semiconductor pattern, wherein the second side is opposite the first side of the third semiconductor pattern.

23. The display device of claim 21, wherein the third thin film transistor is on the active area.

24. The display device of claim 21, wherein the third thin film transistor is on the non-display non-active area.

25. The display device of claim 19, wherein a first insulating layer containing silicon oxide and a second insulating layer containing fluorine silicon nitride are placed between the first semiconductor pattern and the dummy electrode.

* * * * *